(12) United States Patent
Guo (10) Patent No.: US 9,264,014 B2
(45) Date of Patent: Feb. 16, 2016

(54) PACKAGE STRUCTURE FOR DUPLEXER, METHOD OF MANUFACTURING THE SAME AND ELECTRONIC DEVICE WITH THE SAME

(71) Applicant: Ambit Microsystems (Zhongshan) LTD., Zhongshan (CN)

(72) Inventor: Xiao-Ya Guo, Zhongshan (CN)

(73) Assignee: SHUNSIN TECHNOLOGY (ZHONG SHAN) LIMITED, Zhongshan (CN)

( * ) Notice: Subject to any disclaimer, the term of this patent is extended or adjusted under 35 U.S.C. 154(b) by 139 days.

(21) Appl. No.: 14/058,349

(22) Filed: Oct. 21, 2013

(65) Prior Publication Data

US 2015/0028964 A1 Jan. 29, 2015

(30) Foreign Application Priority Data

Jul. 29, 2013 (CN) .......................... 2013 1 0322563

(51) Int. Cl.
*H04B 3/28* (2006.01)
*H03H 7/46* (2006.01)
*H05K 3/28* (2006.01)

(52) U.S. Cl.
CPC .............. *H03H 7/463* (2013.01); *H05K 3/284* (2013.01); *H05K 2201/09909* (2013.01); *H05K 2203/1316* (2013.01); *Y10T 29/4913* (2015.01)

(58) Field of Classification Search
CPC .................. H03H 7/463; H05K 3/284; H05K 2201/09909; H05K 2203/1316

USPC .......................................................... 333/12
See application file for complete search history.

(56) References Cited

U.S. PATENT DOCUMENTS

| 5,375,256 | A | * | 12/1994 | Yokoyama et al. | .............. | 455/80 |
| 5,561,406 | A | * | 10/1996 | Ikata et al. | ..................... | 333/126 |
| 2005/0070045 | A1 | * | 3/2005 | Sunwoo et al. | ............... | 438/106 |
| 2011/0107570 | A1 | | 5/2011 | Hwang et al. | | |

FOREIGN PATENT DOCUMENTS

CN    200410003366.0    4/2010
TW    201201345 A1    1/2012

* cited by examiner

*Primary Examiner* — Robert Pascal
*Assistant Examiner* — Kimberly Glenn
(74) *Attorney, Agent, or Firm* — Novak Druce Connolly Bove + Quigg LLP (57) ABSTRACT

A package structure includes a printed circuit board (PCB), a duplexer, a first dam, a second dam and a cover. The duplexer includes a transmission filter and a reception filter and is electrically connected with the PCB. The first dam is located on a surface of the PCB, and in cooperation with the PCB forms a first receptacle receiving the transmission filter. The second dam is located on the surface of the PCB, and in cooperation with the PCB forms a second receptacle receiving the reception filter. The cover is fixed with top parts of the first dam and the second dam to seal the transmission filter and the reception filter. A method of manufacturing plural such package structures is also provided.

9 Claims, 9 Drawing Sheets

PACKAGE STRUCTURE FOR DUPLEXER, METHOD OF MANUFACTURING THE SAME AND ELECTRONIC DEVICE WITH THE SAME

BACKGROUND

1. Technical Field

The present disclosure relates to electronic device package structures and methods of manufacturing the package structures, and more particularly to a package structure for a duplexer and a method of manufacturing the package structure.

2. Description of Related Art

In a package structure for a duplexer, a sealed space generally exists between the duplexer and a printed circuit board (PCB). The sealed space is formed by a process of dropping glue between a periphery of the duplexer and the PCB. However, in this process, the glue can easily spread to the space during a firing operation. When this happens, the performance of the duplexer is liable to be impaired. In addition, in a typical process, a transmission filter and a reception filter of the duplexer are attached to the PCB by a process of dropping glue drop by drop. This is slow, and results in low production efficiency.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure is illustrated by way of example and not by way of limitation in the figures of the accompanying drawings in which like reference numerals indicate the same or similar elements. It should be noted that references to "an" or "one" embodiment in this disclosure are not necessarily to the same embodiment, and such references can mean "at least one."

Figure 1:
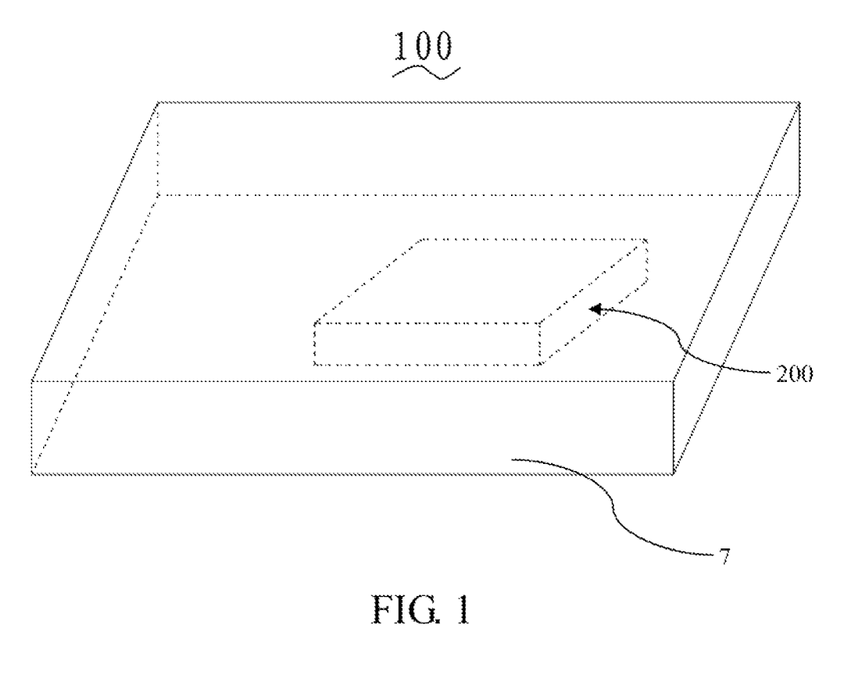
FIG. 1 is a perspective view of an electronic device in accordance with an exemplary embodiment of the present disclosure, the electronic device including a package structure for a duplexer.

FIG. 1 is a perspective view of an electronic device 100 in accordance with an exemplary embodiment of the present disclosure. The electronic device 100 comprises a housing 7, and a package structure 200. The package structure 200 is located in the housing 7.

Figure 2:
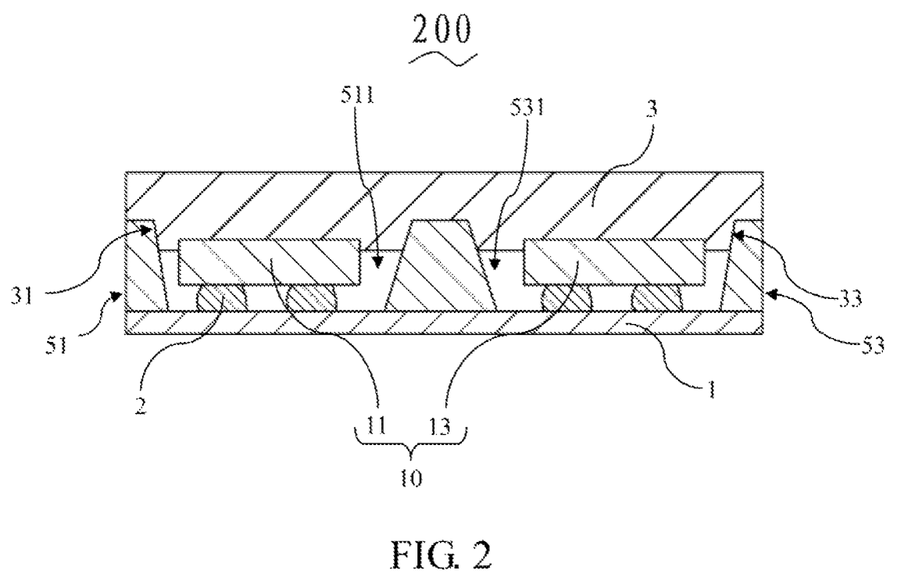
FIG. 2 is a cross-sectional view of the package structure of FIG. 1.

Referring to FIG. 2, the package structure 200 comprises a printed circuit board (PCB) 1, a duplexer 10, a first dam 51, a second dam 53 and a cover 3. The duplexer 10 comprises a transmission filter 11 and a reception filter 13.

Figure 3:
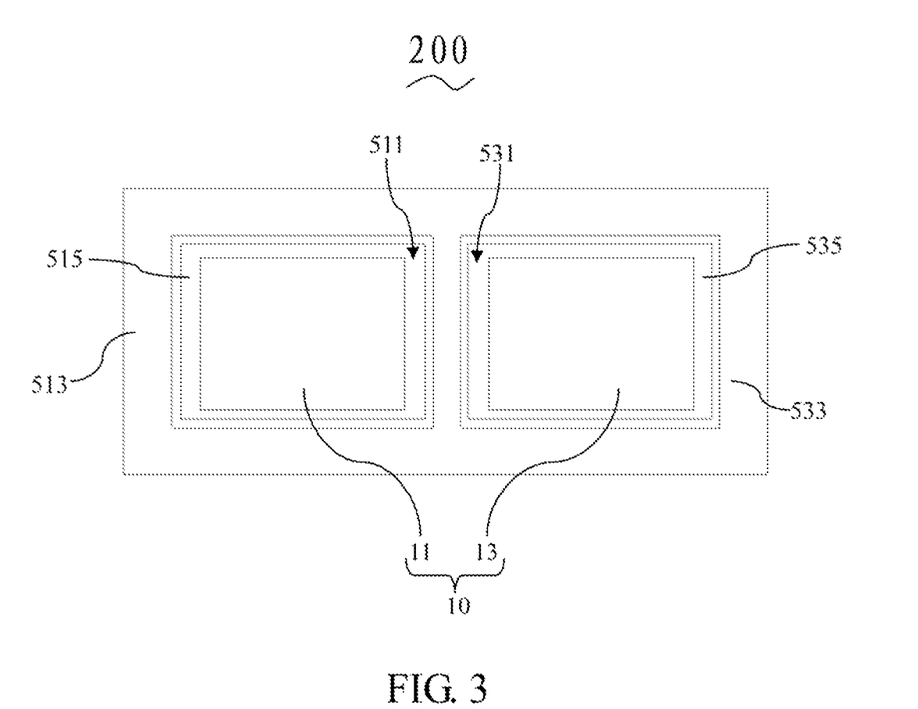
FIG. 3 is a top plan view of the package structure of FIG. 1, but omitting a cover thereof.

Referring also to FIG. 3, the first dam 51 comprises four first sidewalls 513, and is located on the PCB 1. The first dam 51 and the PCB 1 cooperatively form a first receptacle 511. The second dam 53 comprises four second sidewalls 533, and is located on the PCB 1. The second dam 53 and the PCB 1 cooperatively form a second receptacle 531.

In the embodiment, an inner surface of each of the first sidewalls 513 of the first dam 51 is in a shape of an inclined plane, and an inner surface of each of the second sidewalls 533 of the second dam 53 is in a shape of an inclined plane. That is, an inner diameter of the first receptacle 511, as measured along any horizontal direction, gradually increases from the PCB 1 up toward the cover 3. Similarly, an inner diameter of the second receptacle 531, as measured along any horizontal direction, gradually increases from the PCB 1 up toward the cover 3. With this structure, the first dam 51 and the second dam 53 can be firmly combined with the PCB 1, and the first dam 51 and the second dam 53 can be protected from damage during a process of fixing the cover 3 on the first dam 51 and the second dam 53 (see below).

In the embodiment, the first dam 51 is adjacent to the second dam 53. In detail, one of the first sidewalls 513 of the first dam 51 is integrally connected with a corresponding one of the second sidewalls 533 of the second dam 53. That is, these two sidewalls 513, 533 of the first and second dams 51, 53 cooperatively form a single monolithic common sidewall.

Alternatively, the first dam 51 and the second dam 53 may be separate from each other. In other alternative embodiments, the first dam 51 and the second dam 53 may each be in the shape of a ring or a short, hollow cylinder, according to practical requirements.

The PCB 1 comprises a plurality of pads 2. The transmission filter 11 is received in the first receptacle 511, and is electrically connected with the PCB 1 via corresponding pads 2. The reception filter 13 is received in the second receptacle 531, and is electrically connected with the PCB 1 via corresponding pads 2. In the embodiment, a four-sided first gap 515 is formed between the transmission filter 11 and the first dam 51, and a four-sided second gap 535 is formed between the reception filter 13 and the second dam 53.

The cover 3 defines a first receiving recess 31 and a second receiving recess 33. The first receiving recess 31 is four-sided, and corresponds to the first dam 51. The second receiving recess 33 is four-sided, and corresponds to the second dam 53. In assembly, a top part of the first dam 51 is received in the first receiving recess 31, and a top part of the second dam 53 is received in the second receiving recess 33. The cover 3 covers the first receptacle 511 and the second receptacle 531 to seal the transmission filter 11 and the reception filter 13.

During a process of molding the first dam 51 and the second dam 53 on the PCB 1, molten material is filled in a corresponding mold (see below). The whole process of molding the first and second dams 51, 53 is completed in the mold. Therefore the molten material used to make the first and second dams 51, 53 cannot contact the transmission filter 11 or the reception filter 13, and the molten material does not spread into a gap (not labeled) between the transmission filter 11 and the PCB 1 or a gap (not labeled) between the reception filter 13 and the PCB 1. This means the performance of the transmission and reception filters 11, 13 is unimpaired.

In addition, the transmission filter 11 is sealed by the PCB 1, the first dam 51 and the cover 3; and the reception filter 13 is sealed by the PCB 1, the second dam 53 and the cover 3. That is, the transmission filter 11 and the reception filter 13 are separated from each other. This arrangement can prevent the transmission filter 11 and the reception filter 13 from interfering with each other.

Figure 4:
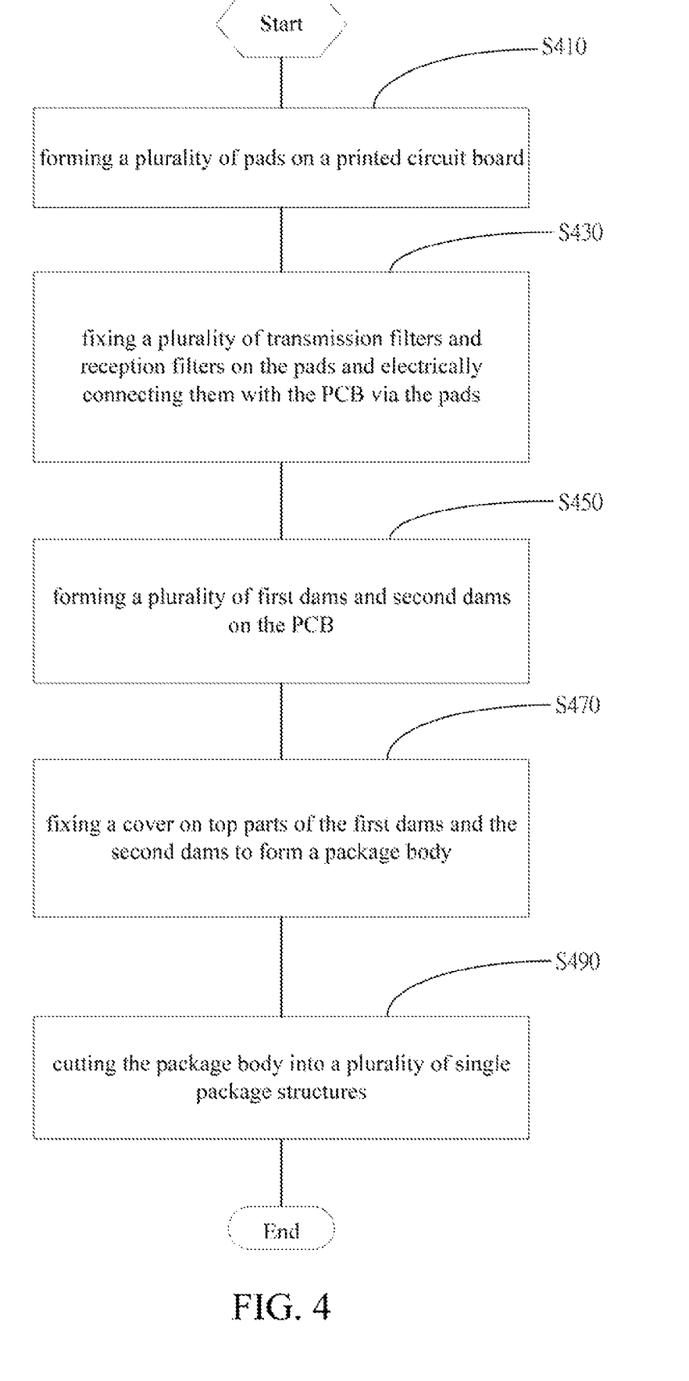
FIG. 4 is a flow chart of an exemplary method of manufacturing a plurality of the package structures of FIG. 1.

Referring to FIG. 4, an exemplary method of manufacturing a plurality of the package structures 200 comprises steps as follows.

In step S410, a plurality of pads 2 is formed on a printed circuit board (PCB) 1.

Figure 7:
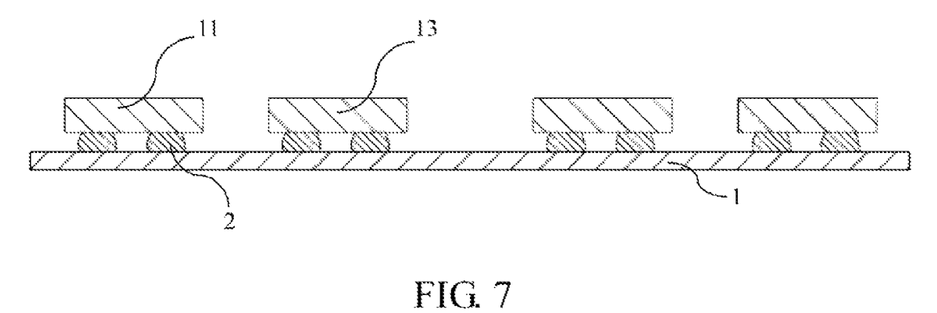
FIG. 7 is a cross-sectional view of welding a plurality of transmission filters and reception filters on the PCB.

In step S430, a plurality of transmission filters 11 and a plurality of reception filters 13 are fixed on the plurality of the pads 2, and are thus electrically connected with the PCB 1 via the pads 2. In the embodiment, the transmission filters 11 and the reception filters 13 are fixed on the pads 2 by welding technology (see FIG. 7).

In step S450, a plurality of first dams 51 and a plurality of second dams 53 are formed on the PCB 1. Each transmission filter 11 corresponds to a respective first dam 51, and each reception filter 13 corresponds to a respective second dam 53. Each first dam 51 and the PCB 1 cooperatively form a first receptacle 511, and each second dam 53 and the PCB 1 cooperatively form a second receptacle 531. Each transmission filter 11 is received in the corresponding first receptacle 511, and each reception filter 13 is received in the corresponding second receptacle 531. In other words, each first dam 51 surrounds the corresponding transmission filter 11, and each second dam 53 surrounds the corresponding reception filter 13. In the embodiment, the plurality of first dams 51 and the plurality of second dams 53 are simultaneously formed by a molding process.

Figure 5:
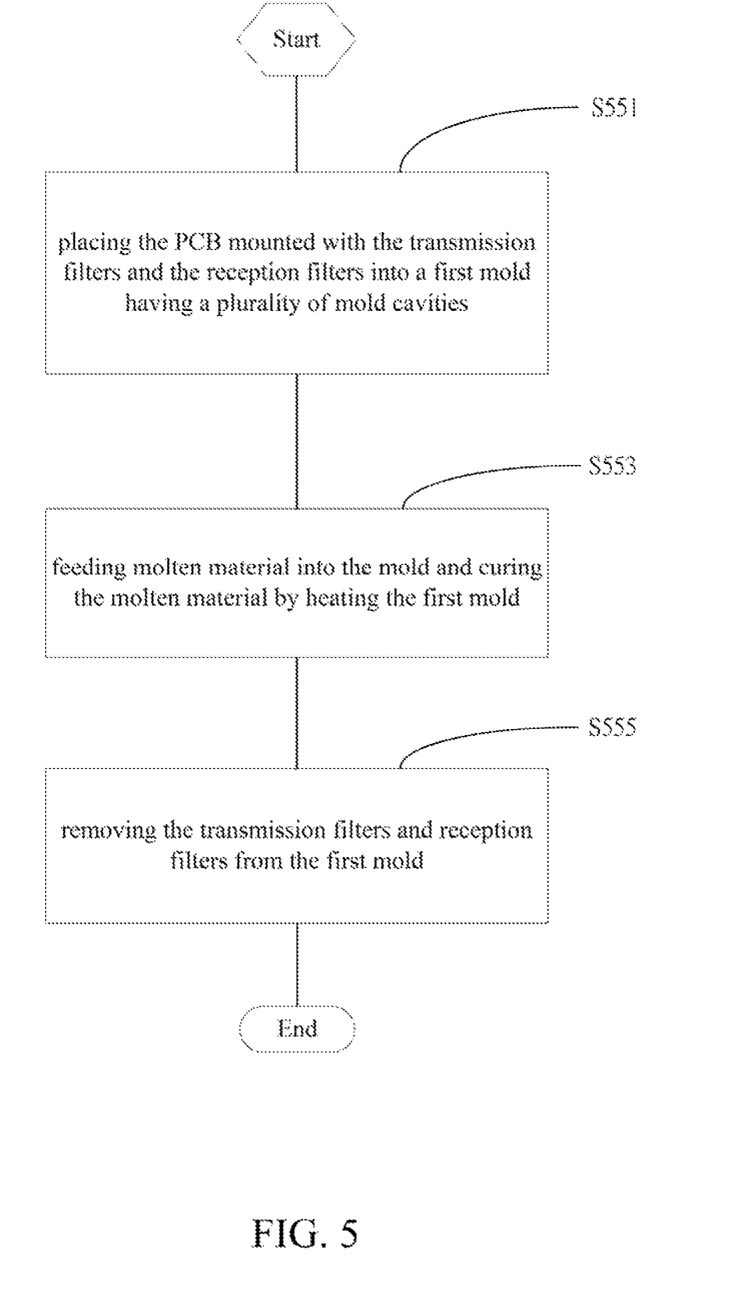
FIG. 5 is a flow chart of details of one step of FIG. 4, namely, an exemplary method of forming a plurality of first dams and a plurality of second dams on a printed circuit board (PCB).

Referring to FIG. 5, in the embodiment, the step of molding the plurality of the first dams 51 and the plurality of second dams 53 comprises steps as follows.

In step S551, the PCB 1 mounted with the plurality of the transmission filters 11 and the plurality of reception filters 13 is placed into a first mold having a plurality of mold cavities. Each transmission filter 11 corresponds to a respective mold cavity, and each reception filter 13 corresponds to a respective mold cavity. In the embodiment, the transmission filters 11 and the reception filters 13 are received in the corresponding mold cavities by pressing the mold on a surface of the PCB 1.

In step S553, molten material is fed into the first mold, and then the molten material is cured by heating the first mold. In the embodiment, the molten material is thermosetting material.

In step S555, the PCB 1 with the plurality of the transmission filters 11 and the reception filters 13 is removed from the first mold. Thus, the plurality of first dams 51 and the plurality of second dams 53 are molded on the PCB 1, and surround the corresponding transmission filters 11 and the corresponding reception filters 13 (see FIG. 8).

Figure 8:
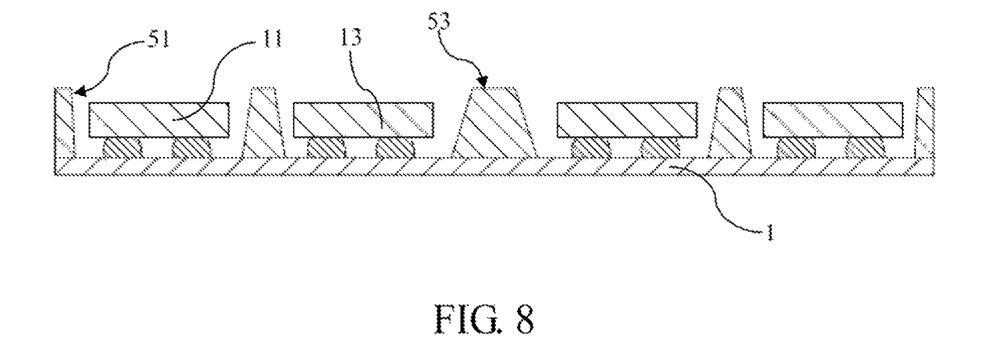
FIG. 8 is a cross-sectional view of forming the first dams and the second dams on the PCB.

In the embodiment, a four-sided first gap 515 is formed between each transmission filter 11 and the corresponding first dam 51, and a four-sided second gap 535 is formed between each reception filter 13 and the corresponding second dam 53.

In step S470, a cover 3 is fixed on top parts of the first dams 51 and the second dams 53. The cover 3 seals the plurality of transmission filters 11 and the plurality of reception filters 13. Thus, a package body is formed (see FIG. 9).

Figure 6:
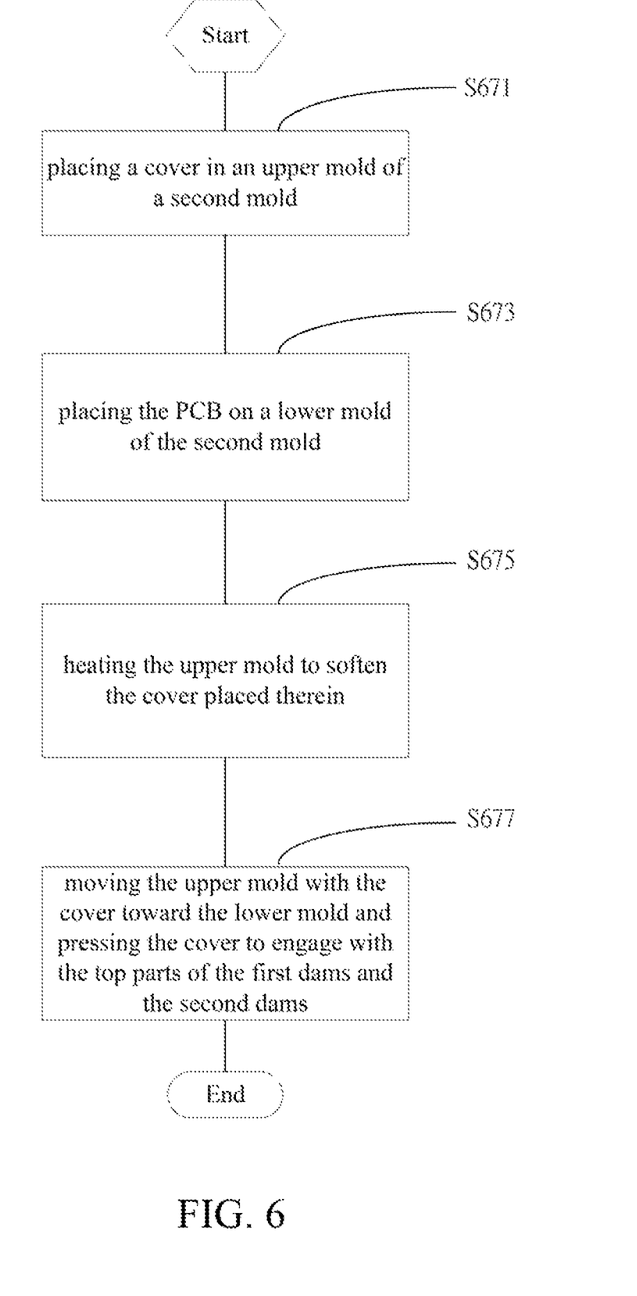
FIG. 6 is a flow chart of details of another step of FIG. 4, namely, an exemplary method of fixing the cover on top parts of the first dams and the second dams.

Referring to FIG. 6, in the embodiment, the step of fixing the cover 3 on the top parts of the first dams 51 and the second dams 53 comprises steps as follows.

In step S671, the cover 3 is placed in a second mold. In the embodiment, the cover 3 is made of sheet molding compound (SMC). In the embodiment, the second mold comprises an upper mold body and a lower mold body. The upper mold body is used to hold the SMC, and the lower mold body is used to support the PCB 1.

In step S673, the PCB 1 is placed on the lower mold body and faces the upper mold body.

In step S675, the upper mold body is heated to soften the SMC placed therein. In the embodiment, the SMC is a kind of material that can be soften when the temperature is increased.

Figure 9:
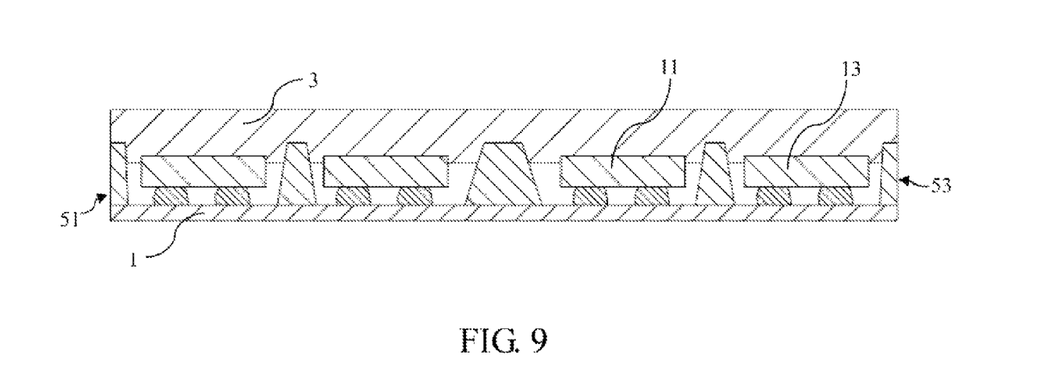
FIG. 9 is a cross-sectional view of fixing the cover on the top parts of the first dams and the second dams.

In step S677, the upper mold body with the cover 3 is moved toward the lower mold body, and the cover 3 is pressed to engage with the top parts of the first dams 51 and the second dams 53. Thus, the package body is formed. In the embodiment, the cover 3 is engaged with the top parts of the first and second dams 51, 53 by a process of compression molding.

In step S490, the package body is cut into a plurality of single (individual) package structures 200. In the embodiment, the package body is cut along one or more cutting lines by a mechanical cutter. Alternatively, the package body is cut by laser cutting technology.

Because the plurality of first dams 51 and the plurality of second dams 53 are formed by one molding process, and because a single cover 3 is used to seal all the transmission filters 11 and reception filters 13 mounted on the PCB 1, the above-described method allows batch processing of several or multiple package structures 200. Thus, the above-described method results in high production efficiency.

Although the features and elements of the present disclosure are described as embodiments in particular combinations, each feature or element can be used alone or in other various combinations within the principles of the present disclosure to the full extent indicated by the broad general meaning of the terms in which the appended claims are expressed.

What is claimed is:

1. A package structure, comprising:
   a printed circuit board (PCB) for supporting electronic elements assembled thereon;
   a duplexer comprising a transmission filter and a reception filter each electrically connected with the PCB;
   a first dam located on a surface of the PCB, wherein the first dam and the PCB cooperatively form a first receptacle, and the first receptacle has the transmission filter received therein;
   a second dam located on the surface of the PCB, wherein the second dam and the PCB cooperatively form a second receptacle, and the second receptacle has the reception filter received therein; and
   a cover covering the first receptacle and the second receptacle and thereby sealing the transmission filter and the reception filter in the first and second receptacles;
   wherein a first gap is formed between the transmission filter and the first dam, a second gap is formed between the reception filter and the second dam, the first dam comprises four first sidewalls, the second dam comprises four second sidewalls, and one of the first sidewalls and one of the second sidewalls cooperatively form a single monolithic common wall;
   wherein an inner surface of each of the first sidewalls of the first dam is in a shape of an inclined plane, and an inner surface of each of the second sidewalls of the second dam is in a shape of an inclined plane.

2. The package structure of claim 1, wherein the cover defines a first receiving recess corresponding to the first dam, and a second receiving recess corresponding to the second dam, the top part of the first dam is received in the first receiving recess, and the top part of the second dam is received in the second receiving recess.

3. A method of manufacturing package structures, the method comprising:
- forming a plurality of pads on a printed circuit board (PCB);
- fixing a plurality of transmission filters and a plurality of reception filters on the pads, thereby electrically connecting the transmission filters and the reception filters with the PCB via the pads;
- forming a plurality of first dams and a plurality of second dams on the PCB, comprising:
  - placing the PCB mounted with the plurality of transmission filters and the plurality of reception filters into a mold having a plurality of mold cavities;
  - feeding molten material into the mold and curing the molten material by heating the mold; and
  - removing the PCB with the plurality of transmission filters and the plurality of reception filters from the mold;
- fixing a cover on top parts of the first dams and the second dams to form a package body; and
- cutting the package body into a plurality of individual package structures.

4. The method of claim 3, wherein the molten material is thermosetting material.

5. The method of claim 3, wherein fixing a cover on top parts of the first dams and the second dams to form a package body comprises:
- placing the cover in an upper mold body of a mold;
- placing the PCB on a lower mold body of the mold, such that the PCB faces the upper mold body;
- heating the upper mold body to soften the cover placed therein; and
- moving the upper mold body with the cover toward the lower mold body and pressing the cover to engage with the top parts of the first dams and the second dams.

6. The method of claim 5, wherein the cover is made of sheet molding compound (SMC).

7. The method of claim 3, wherein a first gap is formed between each transmission filter and the corresponding first dam, and a second gap is formed between each reception filter and the corresponding second dam.

8. An electronic device, comprising:
- a housing; and
- a package structure located in the housing, the package structure comprising:
  - a printed circuit board (PCB) for supporting electronic elements assembled thereon;
  - a duplexer comprising a transmission filter and a reception filter each electrically connected with the PCB;
  - a first dam located on a surface of the PCB, wherein the first dam and the PCB cooperatively form a first receptacle, and the first receptacle has the transmission filter received therein;
  - a second dam located on the surface of the PCB, wherein the second dam and the PCB cooperatively form a second receptacle, and the second receptacle has the reception filter received therein; and
  - a cover covering the first receptacle and the second receptacle and thereby sealing the transmission filter and the reception filter in the first and second receptacles;
  - wherein a first gap is formed between the transmission filter and the first dam, a second gap is formed between the reception filter and the second dam, the first dam comprises four first sidewalls, the second dam comprises four second sidewalls, and one of the first sidewalls and one of the second sidewalls cooperatively form a single monolithic common wall;
  - wherein an inner surface of each of the first sidewalls of the first dam is in a shape of an inclined plane, and an inner surface of each of the second sidewalls of the second dam is in a shape of an inclined plane.

9. The electronic device of claim 8, wherein the cover defines a first receiving recess corresponding to the first dam, a second receiving recess corresponding to the second dam, the top part of the first dam is received in the first receiving recess, and the top part of the second dam is received in the second receiving recess.

* * * * *